United States Patent
Kouno et al.

(10) Patent No.: US 10,027,242 B2
(45) Date of Patent: Jul. 17, 2018

(54) VEHICLE POWER CONVERSION DEVICE

(71) Applicant: KABUSHIKI KAISHA TOSHIBA, Minato-ku, Tokyo (JP)

(72) Inventors: Yuusuke Kouno, Tachikawa Tokyo (JP); Masayuki Nogi, Hachioji Tokyo (JP); Nobumitsu Tada, Hachioji Tokyo (JP); Yuuki Tsukinari, Tokorozawa Saitama (JP); Yosuke Nakazawa, Kunitachi Tokyo (JP); Tomoyuki Makino, Iruma Saitama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 41 days.

(21) Appl. No.: 15/317,394

(22) PCT Filed: Jul. 31, 2014

(86) PCT No.: PCT/JP2014/070274
§ 371 (c)(1),
(2) Date: Dec. 8, 2016

(87) PCT Pub. No.: WO2015/190005
PCT Pub. Date: Dec. 17, 2015

(65) Prior Publication Data
US 2017/0170744 A1    Jun. 15, 2017

(30) Foreign Application Priority Data
Jun. 10, 2014    (JP) .................................. 2014-120008

(51) Int. Cl.
*H02M 7/217*    (2006.01)
*H02M 7/02*    (2006.01)
(Continued)

(52) U.S. Cl.
CPC ........... *H02M 7/003* (2013.01); *H02M 7/217* (2013.01); *H05K 7/209* (2013.01); *H05K 7/20854* (2013.01)

(58) Field of Classification Search
CPC ........ H02M 7/003; H02M 7/217; H02M 7/02; H02M 7/5387; H05K 7/20854; H05K 7/209
See application file for complete search history.

(56) References Cited

U.S. PATENT DOCUMENTS 9,450,509 B2    9/2016    Kouno et al.
2014/0375121 A1    12/2014    Kouno et al.

FOREIGN PATENT DOCUMENTS

EP    1498015 B1    7/2011
JP    2004007941 A    1/2004
(Continued)

OTHER PUBLICATIONS

International Search Report (ISR) and Written Opinion dated Oct. 14, 2014 issued in International Application No. PCT/JP2014/070274.
(Continued)

*Primary Examiner* — Rexford Barnie
*Assistant Examiner* — Thai Tran
(74) *Attorney, Agent, or Firm* — Holtz, Holtz & Volek PC

(57) ABSTRACT

A vehicle power conversion device includes a two-level converter, a three-level converter and one cooling device. The two-level converter includes a capacitor, first switching devices and second switching devices. The three-level converter includes two capacitors, third switching devices, fourth switching devices and a bidirectional switch. The first and second switching devices are embedded in first power modules, and the third and fourth switching devices are embedded in second power modules. The second power (Continued)

modules have dielectric strength voltages at least equal to a voltage applicable to any one of the two capacitors connected in series included in the three-level converter, and the first power modules have dielectric strength voltages at least equal to a sum of a voltage applicable to any one of the two capacitors connected in series included in the three-level converter and a voltage applicable to the capacitor included in the two-level converter.

7 Claims, 10 Drawing Sheets

(51) Int. Cl.
*H02M 7/5387* (2007.01)
*H02M 7/00* (2006.01)
*H05K 7/20* (2006.01)

(56) References Cited

FOREIGN PATENT DOCUMENTS

| JP | 2008245451 A | 10/2008 |
|---|---|---|
| JP | 2013198200 A | 9/2013 |
| JP | 2014143854 A | 8/2014 |
| JP | 2014239580 A | 12/2014 |
| WO | 03088728 A1 | 10/2003 |
| WO | 2013136377 A1 | 9/2013 |

OTHER PUBLICATIONS

Ruedi et al, "Driver Solutions for High-voltage IGBTs", PCIM Europe—Power Electronics Magazine, Apr. 30, 2002, pp. 1-11, XP055146882.

Jimbo et al, "Advanced Inverter Control System Using a High-Volatge IGBT", Hitachi Review, Hitachi Ltd. Tokyo, JP, vol. 43, No. 6, Dec. 1, 1994, pp. 245-250, XP000533459, ISSN: 0018-277X.

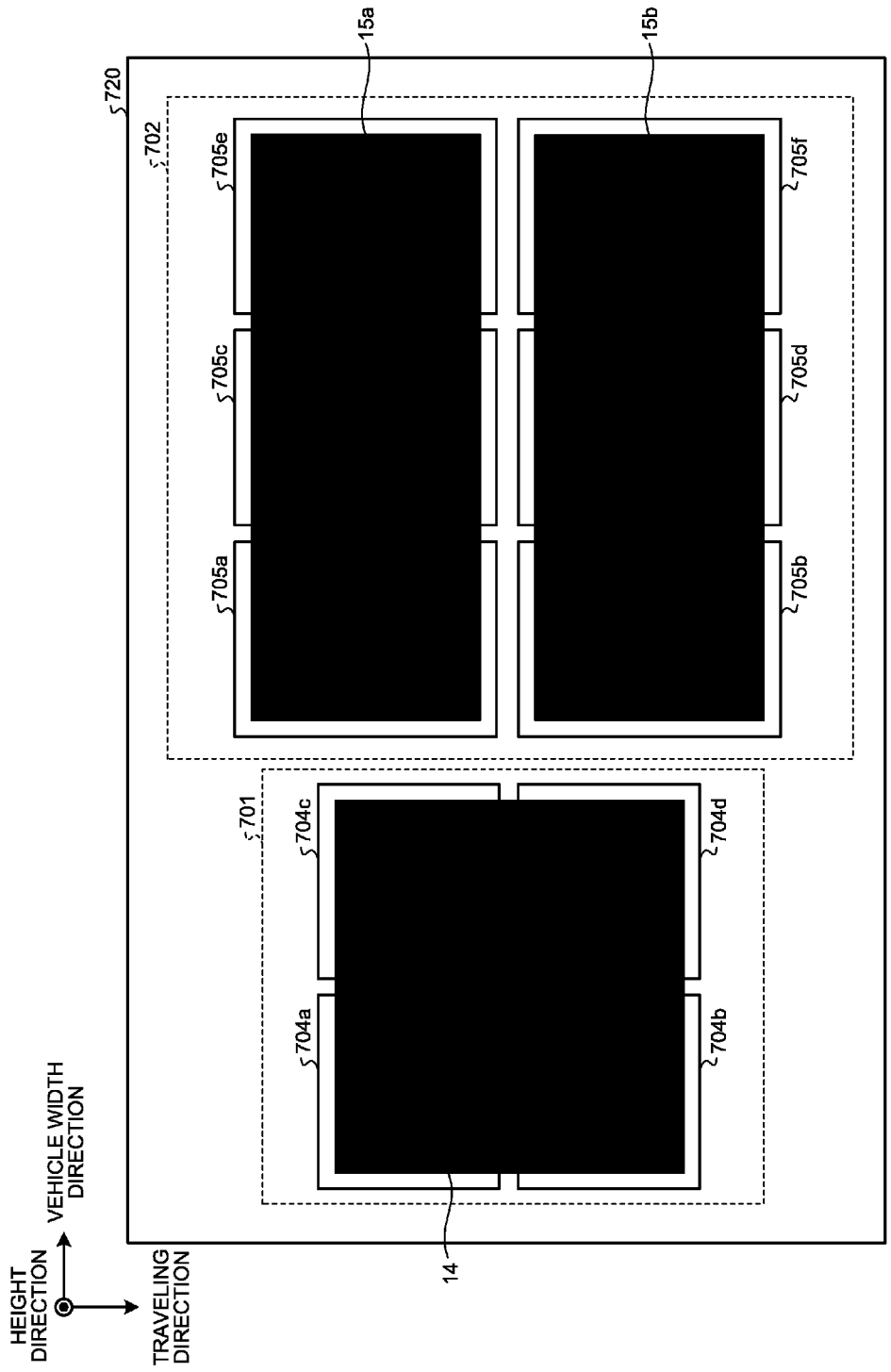

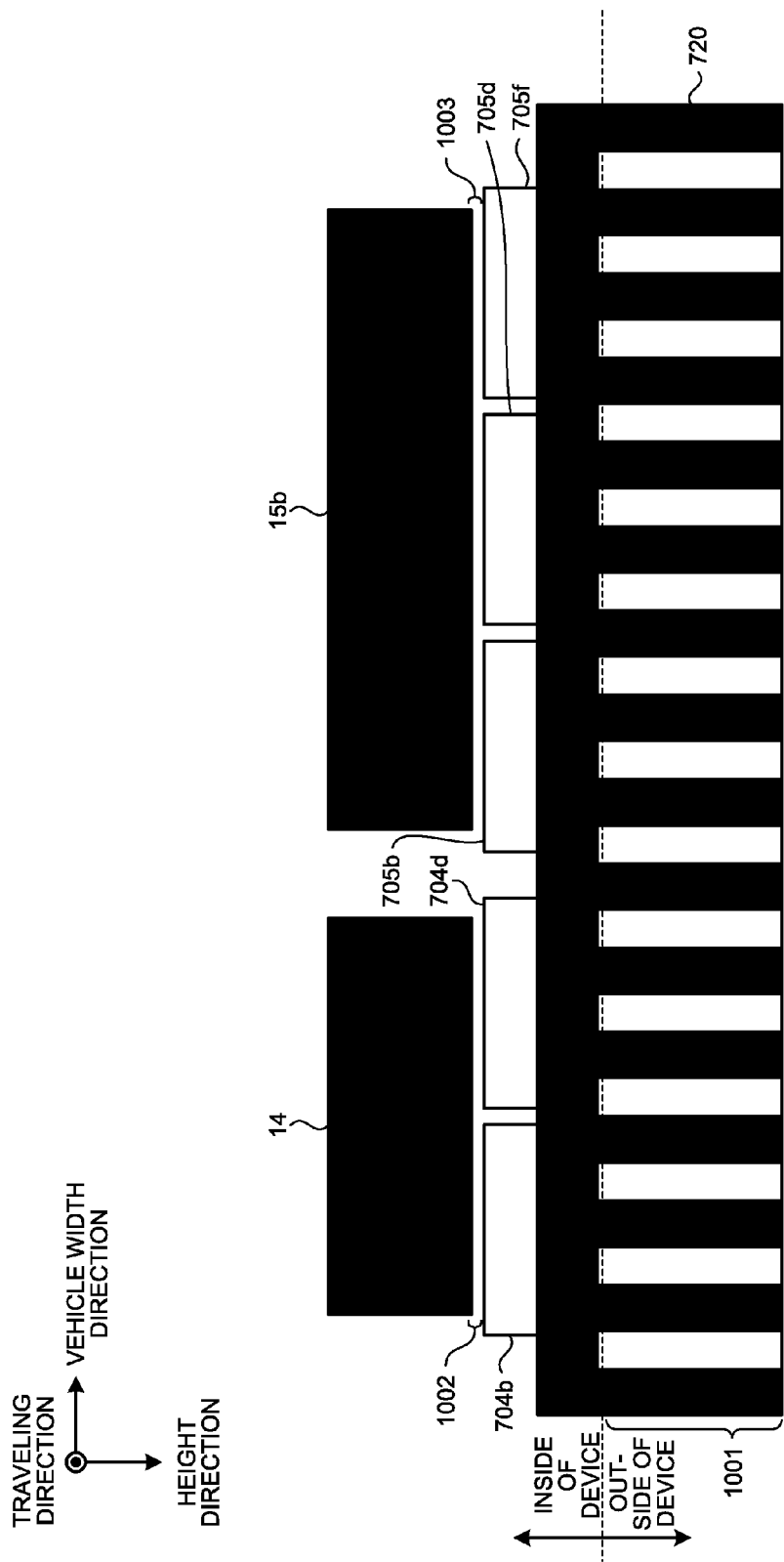

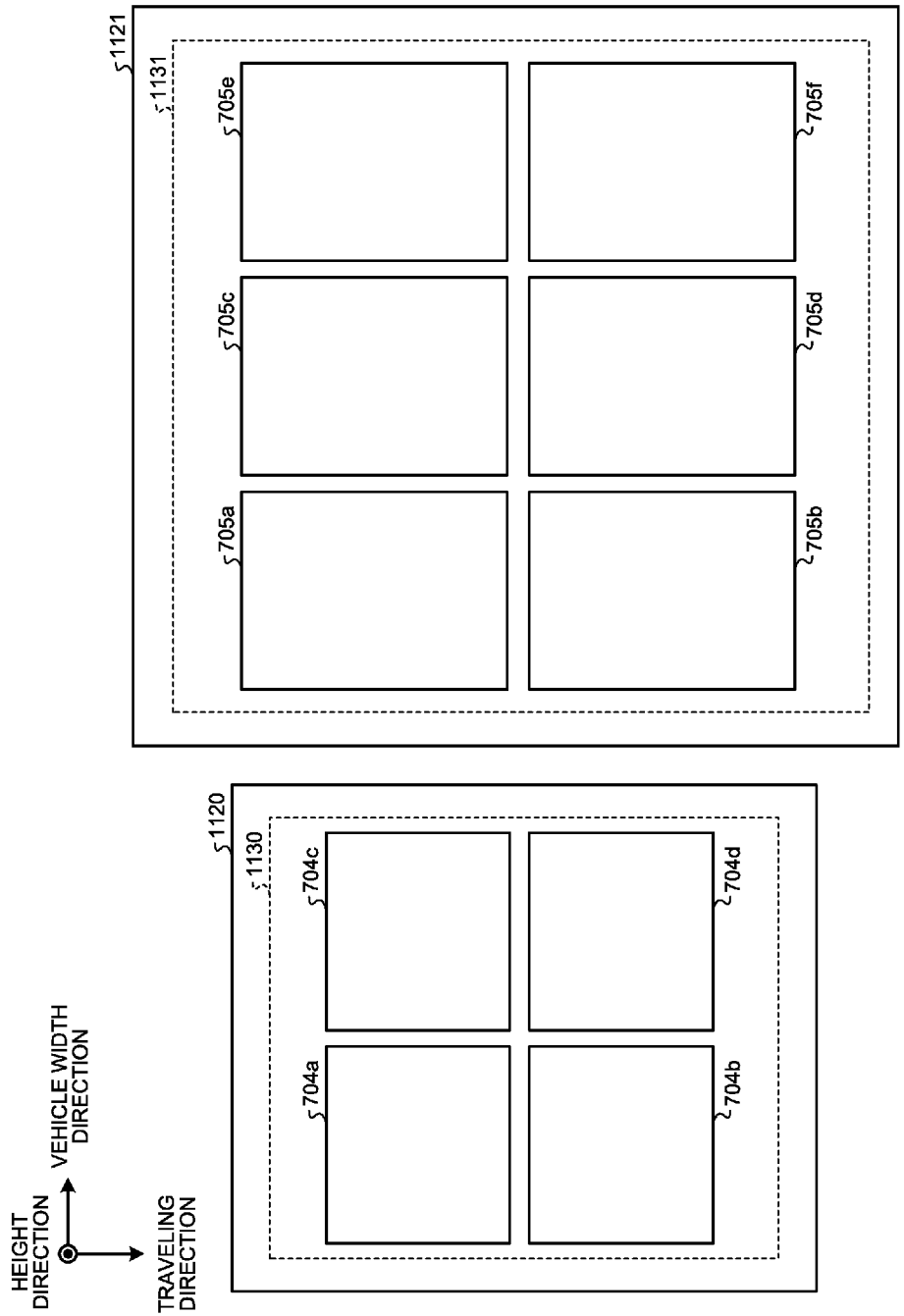

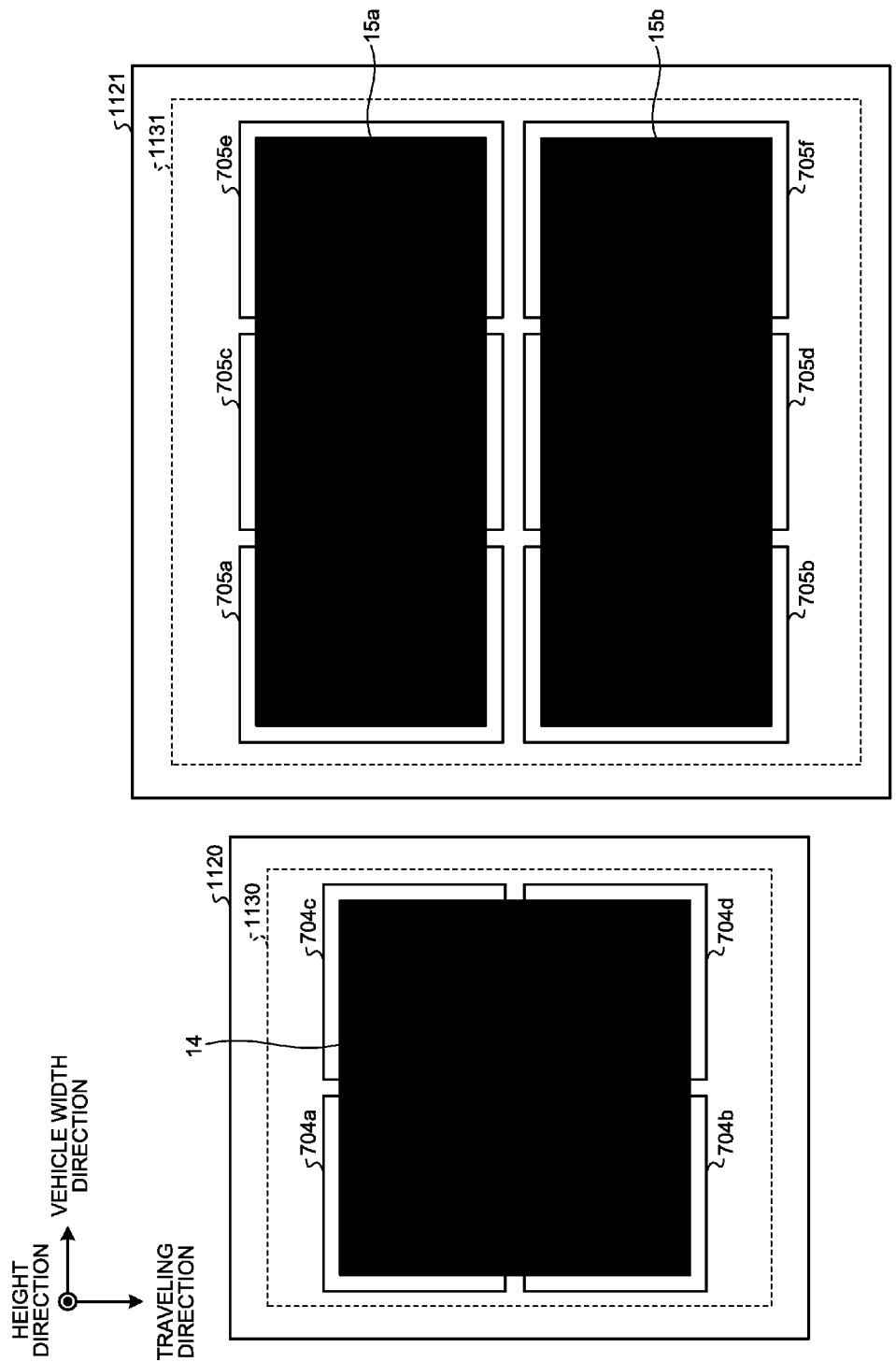

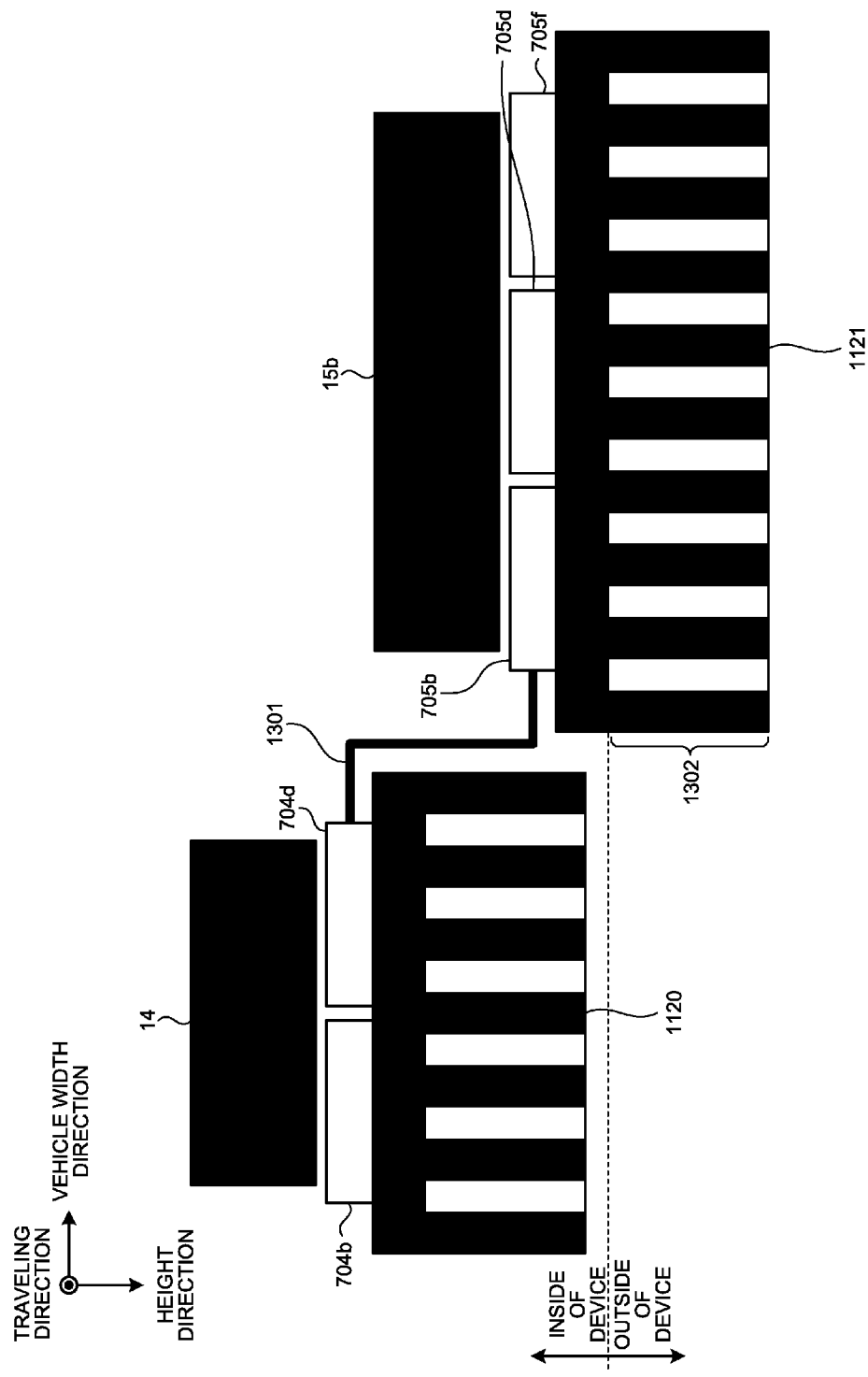

VEHICLE POWER CONVERSION DEVICE

CROSS-REFERENCE TO RELATED APPLICATIONS

This application is a U.S. National Phase patent application of International Application No. PCT/JP2014/070274, filed Jul. 31, 2014, which designates the United States, incorporated herein by reference, and which claims the benefit of priority from Japanese Patent Application No. 2014-120008, filed Jun. 10, 2014, the entire contents of which are incorporated herein by reference.

FIELD

Embodiments described herein relate generally to a vehicle power conversion device.

BACKGROUND

Conventionally, a converter is constructed of a diode-clamped three-level circuit in many cases. A low-loss device, such as a silicon carbide element, that is under development in recent years is expected to be applied to such a converter to contribute to size reduction of a converter device.

However, although some that can withstand high voltage have started to be available among silicon carbide elements and the like currently provided, those are expensive and need to be tested for reliability. For this reason, under the current situation, use of a silicon carbide element that has low breakdown voltage is practical. When such an element is used, it is necessary that elements be connected in series or be connected in multiple levels in combination with existing silicon elements. When these two options are considered, connecting elements in series involves such disadvantages as an increase in loss, an increase in the number of elements, and balance control. Connecting elements in multiple levels is therefore more advantageous under the current situation.

Given this situation, a multilevel circuit that includes a single-phase three-level converter and a single-phase two-level converter connected in series has been proposed.

In a conventional technique, however, a cooling device needs to be included for cooling power modules included in the single-phase two-level converter and the single-phase three-level converter, respectively, that are included in the multilevel circuit. When this cooling device is exposed to the outside environment so as to perform cooling by use of traveling wind of a vehicle, this cooling device needs to be grounded. In this case, a potential difference occurs between the cooling device and each of the power modules. Therefore, a measure such as provision of an insulation medium between the cooling device and the power module needs to be taken. It can be considered that such a measure not only complicates the structure but also deteriorates the cooling performance because of the insulating medium interposed therebetween.

BRIEF DESCRIPTION OF DRAWINGS

FIG. 6 is a diagram illustrating an example of the arrangement of capacitors according to the first embodiment as viewed from above;

FIG. 7 is a diagram illustrating an example of an arrangement when the vehicle power conversion device according to the first embodiment is viewed from one side;

FIG. 8 is a diagram illustrating an example of the arrangement of power modules included in a vehicle power conversion device according to a second embodiment;

FIG. 9 is a diagram illustrating an example of the arrangement of capacitors according to the second embodiment as viewed from above; and FIG. 10 is a diagram illustrating an exemplary arrangement according to the second embodiment when the vehicle power conversion device is viewed from one side.

DETAILED DESCRIPTION

Figure 1:
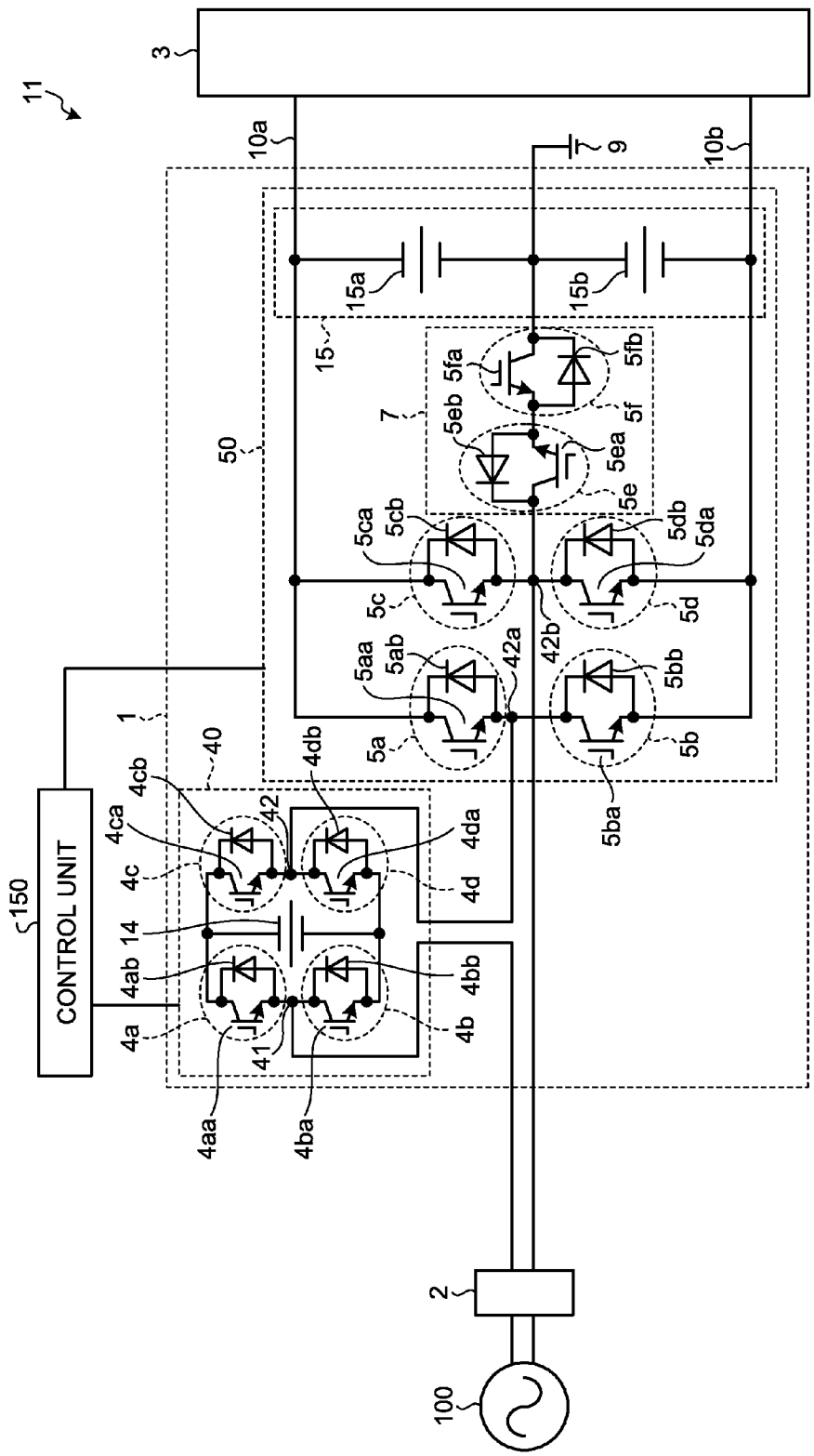
FIG. 1 is a diagram illustrating an example of the configuration of a vehicle power conversion device according to a first embodiment.

According to an embodiment, a vehicle power conversion device is a power conversion device that converts single-phase alternating-current power into direct-current power. The vehicle power conversion device comprises a two-level converter, a three-level converter one cooling device, first power modules and second power modules. The two-level converter comprises a capacitor, first switching devices and second switching devices. The first switching devices are connected in series to each other via a first connection point and are connected in parallel to the capacitor. The first switching devices each includes a switching element having self arc-extinguishing capability and a diode connected in an anti-parallel manner to the switching element. The first connection point is connected to a power supply that supplies the single-phase alternating-current power. The second switching devices are connected in series to each other via a second connection point and are connected in parallel to the capacitor. Each of the second switching devices has the same configuration as each of the first switching devices. The three-level converter comprises two capacitors, third switching devices, fourth switching devices and a bidirectional switch. The two capacitors are connected in series to each other. The third switching devices are connected in series to each other via a third connection point and are connected in parallel to the two capacitors connected in series to each other. The third connection point is connected to the second connection point. Each of the third switching devices has the same configuration as each of the first switching devices. The fourth switching devices are connected in series to each other via a fourth connection point and connected in parallel to the two capacitors connected in series to each other. Each of the fourth switching devices has the same configuration as each of the first switching devices. The bidirectional switch is provided on a path from the fourth connection point to a neutral point. The bidirectional switch includes a plurality of switching devices connected in series to one another with the polarities thereof reversed to one another. The first power modules are modules in which the respective first and second switching devices are embedded. The second power modules are modules in which the respective third and fourth switching devices are embedded. The first power module and the second power module are installed on the one cooling device. The second power modules have dielectric strength voltages equal to or higher than a voltage applicable to any one of the two capacitors connected in series to each other included in the three-level converter, and the first power modules have dielectric strength voltages equal to or higher than a sum of a voltage applicable to any one of the two capacitors connected in series to each other included in the three-level converter and a voltage applicable to the capacitor included in the two-level converter.

First Embodiment

FIG. 1 is a diagram illustrating the configuration of a vehicle power conversion device 11 that includes a multi-level converter 1 for a vehicle according to a first embodiment. As illustrated in FIG. 1, the vehicle power conversion device 11 according to the present embodiment includes a single-phase three-level converter 50 and a single-phase two-level converter 40 connected in series.

Connected to an alternating-current power supply 100 of a power system or the like through a passive element 2 that has a reactor component, the vehicle power conversion device 11 supplies power to a load 3 after converting single-phase alternating-current power into direct-current power. This embodiment is not intended to limit a vehicle on which the vehicle power conversion device 11 is mounted, and the vehicle power conversion device 11 may be mounted on various vehicles. The load 3 is constructed of an inverter and a motor but may be constructed of any components.

A control unit 150 controls the single-phase three-level converter 50 and the single-phase two-level converter 40.

The single-phase two-level converter 40 is a single-phase converter, and includes switching devices 4a to 4d and a (direct-current) capacitor 14. In the single-phase two-level converter 40, the two switching devices 4a and 4b are connected in series to each other via a first connection point 41 connected to the alternating-current power supply 100 that supplies single-phase alternating-current power and are connected in parallel to the capacitor 14, and the two switching devices 4c and 4d are connected in series to each other via a second connection point 42 and are connected in parallel to the capacitor 14.

The respective switching devices 4a to 4d include: transistors (switching devices) 4aa, 4ba, 4ca, and 4da each having the self arc-extinguishing capability and configured to perform switching; and reflux diodes 4ab, 4bb, 4cb, and 4db connected in an anti-parallel manner to the respective transistors 4aa, 4ba, 4ca, and 4da. The single-phase two-level converter 40 according to the present embodiment is constructed of silicon carbide (SiC) devices. The single-phase two-level converter 40 can reduce a switching loss by using silicon carbide (SiC) devices.

The single-phase two-level converter 40 has the switching device 4a and the switching device 4b connected in series to each other between the capacitor 14 and the alternating-current power supply 100. The switching device 4a is provided to the positive potential side of the capacitor 14, and the switching device 4b is provided to the negative potential side of the capacitor 14. The single-phase two-level converter 40 uses the first connection point 41 between the switching device 4a and the switching device 4b as an alternating-current input/output point, and is connected through the first connection point 41 to the alternating-current power supply 100 of a power system or the like through the passive element 2 that has a reactor component.

The single-phase two-level converter 40 further has the switching device 4c and the switching device 4d connected to each other in series between the capacitor 14 and the load 3. The switching device 4c is provided to the positive potential side of the capacitor 14, and the switching device 4d is provided to the negative potential side of the capacitor 14. The single-phase two-level converter 40 is connected through the second connection point 42 (alternating-current input/output point) between the switching device 4c and the switching device 4d to the single-phase three-level converter 50.

Next, the single-phase three-level converter 50 connected between the single-phase two-level converter 40 and the load 3 is described. The single-phase three-level converter 50 includes two legs, a bidirectional switching device 7, and a capacitor part 15 (composed of a capacitor 15a and a capacitor 15b).

In the single-phase three-level converter 50, the two capacitors 15a and 15b connected in series to each other are provided, two switching devices 5a and 5b are connected in series to each other via a third connection point 42a (connected to the second connection point 42) and connected in parallel to the two capacitors 15a and 15b connected in series to each other, two switching devices 5c and 5d are connected in series to each other via a fourth connection point 42b and connected in parallel to the two capacitors 15a and 15b connected in series to each other, and the bidirectional switching device including a plurality of switching devices 5e and 5f connected in series to each other with the polarities thereof reversed to each other is provided on a path from the fourth connection point 42b to a neutral point 9.

Here, the respective switching devices 5a to 5f include: transistors (switching devices) 5aa, 5ba, 5ca, 5da, 5ea, and 5fa each having the self arc-extinguishing capability and configured to perform switching; and (reflux) diodes 5ab, 5bb, 5cb, 5db, 5eb, and 5fb connected in an anti-parallel manner to the respective transistors 5aa, 5ba, 5ca, 5da, 5ea, and 5fa.

One of the two legs included in the single-phase three-level converter 50 is constructed of the switching device 5a and the switching device 5b. The switching devices 5a and 5b are connected to each other in series. The switching device 5a is connected between the positive potential of the capacitor part 15 and the third connection point 42a. The switching device 5b is connected between the negative potential of the capacitor part 15 and the third connection point 42a. The third connection point 42a is provided as a point that is connected to the second connection point 42.

The other one of the two legs included in the single-phase three-level converter 50 is composed of the switching device 5c and the switching device 5d. The switching devices 5c and 5d are connected to each other in series. The switching device 5c is connected between the positive potential of the capacitor part 15 and the fourth connection point 42b (that is connected to the bidirectional switching device 7 and to the neutral point 9 side). The switching device 5d is connected between the negative potential of the capacitor part 15 and the fourth connection point 42b.

The single-phase three-level converter 50 uses the fourth connection point 42b that connect the switching devices 5c, 5d, and 5e to one another as an alternating-current input/output point, and is connected to the alternating-current power supply 100 of a power system or the like through the passive element 2 that has a reactor component.

The fourth connection point 42b (an alternating-current input/output point of the other leg) in the two legs is connected on the load 3 side thereof to the bidirectional switching device 7. The bidirectional switching device 7 includes the switching devices 5e and 5f connected in series to each other with the polarities thereof reversed to each other. The load 3 side of the bidirectional switching device 7 is connected to the capacitor part 15.

The capacitor part 15 includes the capacitor 15a and the capacitor 15b. The capacitor 15a and the capacitor 15b are connected in series to each other. The capacitor 15a has the positive side thereof connected to a positive potential conducting wire 10a of the load 3 and has the negative side thereof connected to the neutral point 9. The capacitor 15b has the positive side thereof connected to the neutral point 9 and has the negative side thereof connected to a negative potential conducting wire 10b of the load 3. An interconnecting part between the capacitors 15a and 15b connected in series to each other within the capacitor part 15 is connected to the neutral point 9.

While the single-phase two-level converter 40 according to the present embodiment is constructed of silicon carbide (SiC) devices or the like, which operate with low switching losses, as described above, the single-phase three-level converter 50 is constructed of silicon devices or the like that have high breakdown-voltage. Consequently, the single-phase two-level converter 40 can operate with a smaller switching loss than the single-phase three-level converter 50. As a result, even when the number of times the single-phase two-level converter 40 performs switching is increased, the resulting switching loss can be maintained low. In contrast, the single-phase three-level converter 50 has higher voltage resistance than the single-phase two-level converter 40.

As illustrated in FIG. 1, when the neutral point 9 is grounded, the switching devices 5a to 5f each have, relative to a grounded point, a potential corresponding to a voltage across the capacitor 15a or 15b with the neutral point 9 taken as a base point. In contrast, the switching devices 4a to 4d each have a potential corresponding to a voltage obtained by adding a voltage across the capacitor 14 to the voltage across the capacitor 15a or 15b with the neutral point 9 taken as a base point. For this reason, it is necessary that insulation in the vehicle power conversion device 11 be designed in consideration of the potential difference between the single-phase three-level converter 50 and the single-phase two-level converter 40.

Within the basic output cycle of the single-phase three-level converter 50, five-step adjustment can be performed on the output voltage of the single-phase three-level converter. Switching phases of the (controllable) switching devices 5a to 5f included in the single-phase three-level converter 50 are controlled. Next, command value voltages of the vehicle power conversion device 11, including the output voltages at five steps in the single-phase three-level converter 50, is described.

Figure 2:
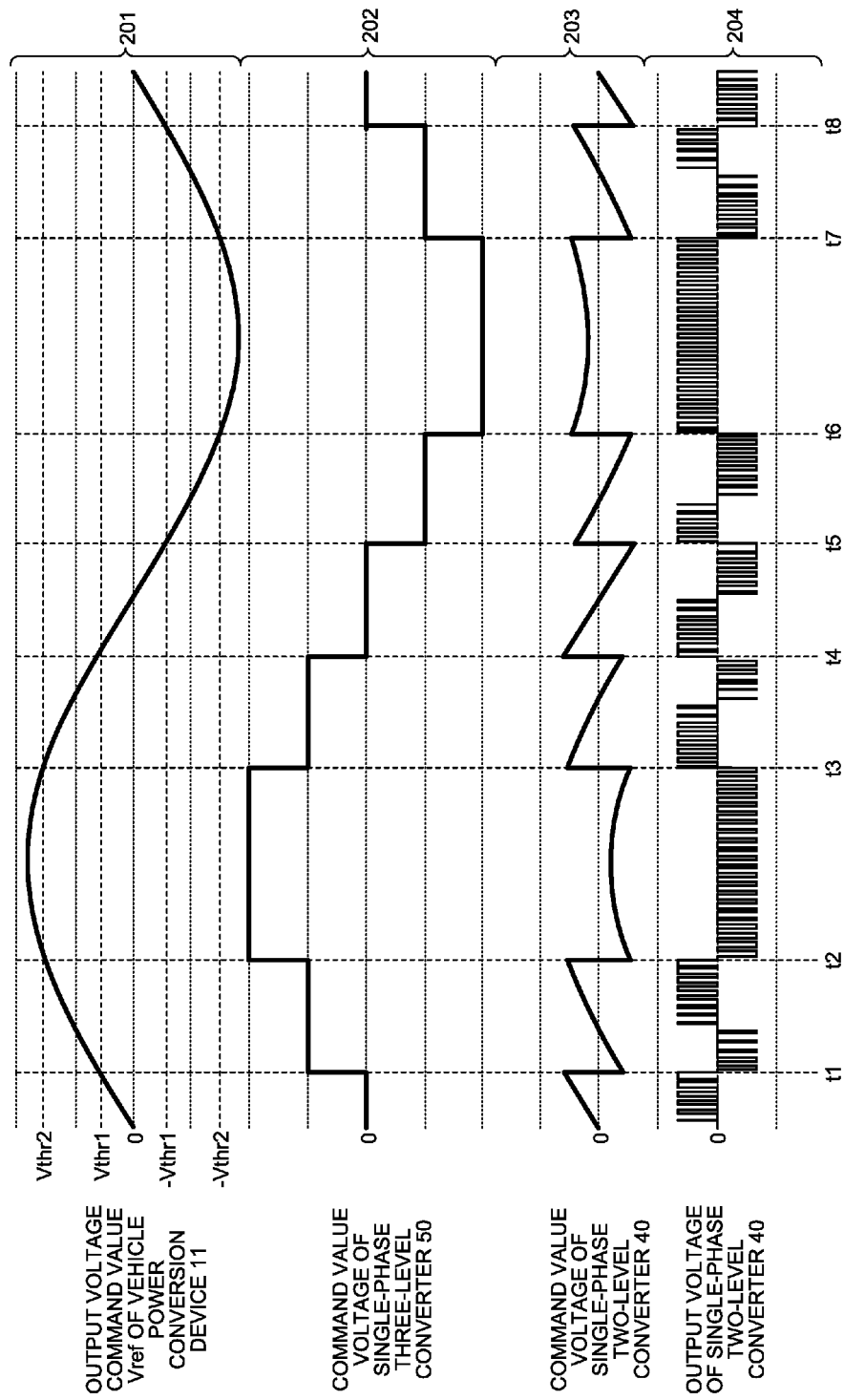
FIG. 2 is a diagram illustrating an example of command value voltages of respective converters, the command value voltages corresponding to an output voltage instruction provided to the vehicle power conversion device according to the first embodiment.

FIG. 2 is a diagram illustrating command value voltages of respective converters, the command value voltages corresponding to an output voltage command provided to the vehicle power conversion device 11 according to the first embodiment. Illustrated in FIG. 2 are an output voltage command value Vref 201 of the vehicle power conversion device 11, a command value voltage 202 of the single-phase three-level converter 50, a command value voltage 203 of the single-phase two-level converter 40, and an output voltage 204 of the single-phase two-level converter 40.

That is, the vehicle power conversion device 11 according to the present embodiment implements the output voltage command value Vref 201 of the vehicle power conversion device 11 by combining the command value voltage 202 of the single-phase three-level converter 50 and the command value voltage 203 of the single-phase two-level converter 40.

In the vehicle power conversion device 11 according to the present embodiment, the single-phase two-level converter 40 is controlled so that detailed changes in the output voltage command value Vref 201 can be followed with the switching frequency of the single-phase two-level converter 40, which operates with a low switching loss, set higher than that of the single-phase three-level converter 50. Thus, detailed voltage control and reduction of a switching loss are both enabled.

In general, a device that operates with a low switching loss tends to exhibit low voltage resistance. In consideration of this, the present embodiment is designed so that, in order to enable large changes in voltage, control for providing a step-like waveform can be performed on the single-phase three-level converter 50 that has high voltage resistance.

In the present embodiment, threshold values for outputting direct-current power from the capacitors 15a and 15b in the single-phase three-level converter 50 are set on the output voltage command value Vref 201 of the vehicle power conversion device 11. For example, threshold values on a voltage for outputting direct-current power from any one of the capacitors 15a and 15b in the single-phase three-level converter 50 are set to ±Vthr1. Furthermore, threshold values on a voltage for outputting direct-current power from both of the capacitors 15a and 15b in the single-phase three-level converter 50 are set to ±Vthr2. With these threshold values, the control unit 150 controls the switching devices 5a to 5f included in the single-phase three-level converter 50, based on whether the output voltage command value Vref exceeds the voltage threshold values ±Vthr1 and the voltage threshold values ±Vthr2.

As indicated by the command value voltage 202 in FIG. 2, the output voltage value of the single-phase three-level converter 50 is controlled in five levels, which are: negative full voltage (by both the capacitors 15a and 15b); negative half voltage (by any one of the capacitors 15a and 15b); 0; positive half voltage (by any one of the capacitors 15a and 15b); and positive full voltage (by the capacitors 15a and 15b). In addition, the control unit 150 controls phases corresponding to times t1 to t8, each of which is a timing of when the output voltage value is changed from one level to another in the five levels.

Furthermore, based on the command value voltage 203 of the single-phase two-level converter 40, the control unit 150 performs control to form output voltage 204 of the single-phase two-level converter 40. Next, specific control on the switching devices is described.

Figure 3:
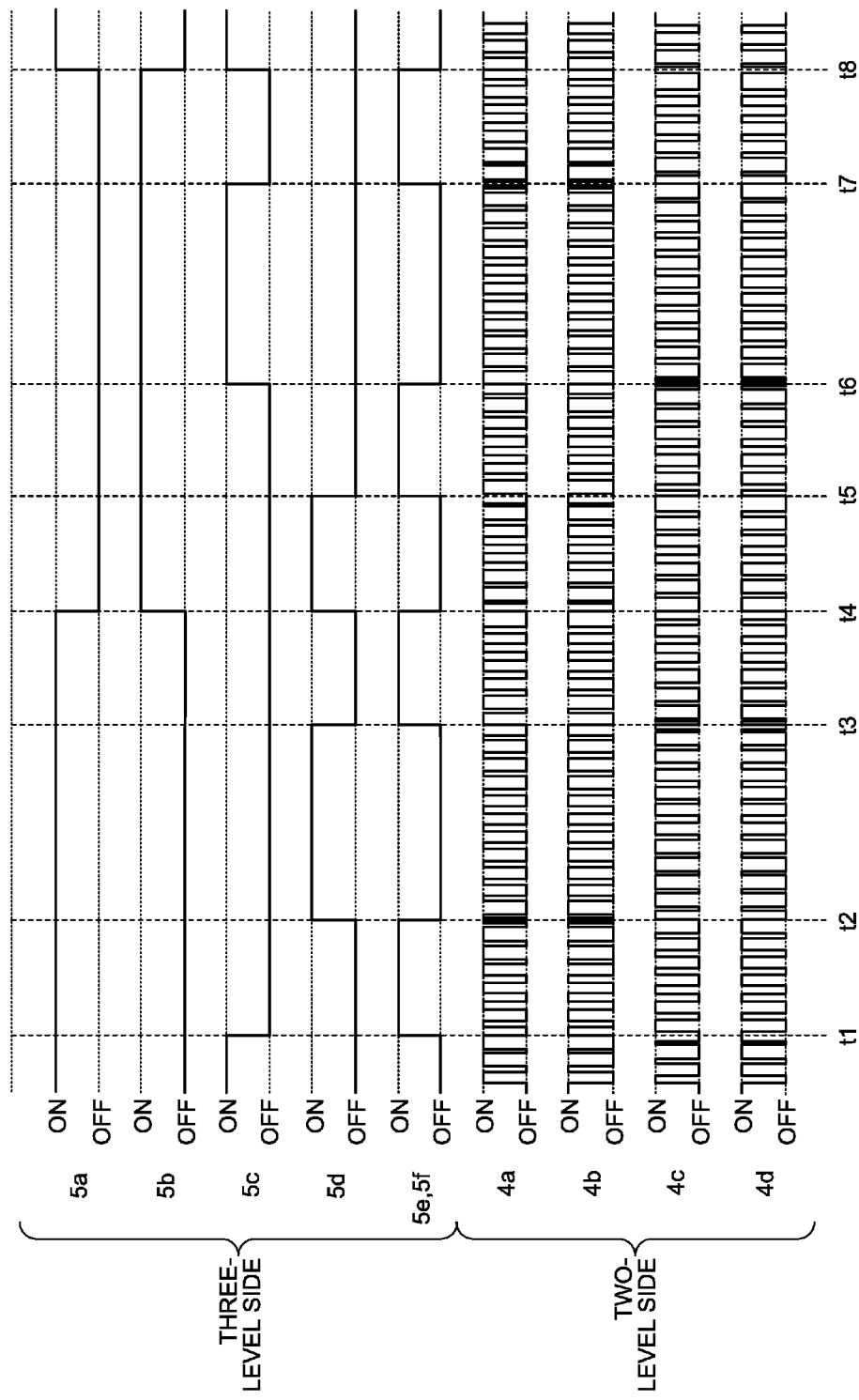
FIG. 3 is a diagram illustrating an example of switching control by switching devices included in the respective converters according to the first embodiment.

FIG. 3 is a diagram illustrating switching control by the switching devices included in the individual converters. In the example illustrated in FIG. 3, switching control of the switching devices 5a to 5f on the part of the single-phase three-level converter 50 and switching control of the switching devices 4a to 4d on the part of the single-phase two-level converter 40 are illustrated.

Here, while a condition "Vthr1≥Vref≥−Vthr1" is satisfied (between the times 0 and t1, between the times t4 and t5, and after the time t8), the control unit 150 puts any one of the following combinations of switching devices included in the single-phase three-level converter in the ON state: "the switching device 5a and the switching device 5c"; and "the switching device 5b and the switching device 5d" included in the single-phase three-level converter 50. Consequently, voltages across the capacitors 15a and 15b are not superimposed on the output voltage of the single-phase three-level converter 50, and the control unit 150 therefore outputs the output voltage command value Vref for the entire converter by performing pulse-width modulation control on the single-phase two-level converter 40.

While a condition "Vthr2≥Vref>Vthr1" is satisfied (between the times t1 and t2 and between the times t3 and t4), the control unit 150 performs control to put the switching devices 5a, 5e, and 5f included in the single-phase three-level converter 50 in the ON state. Consequently, the voltage across the capacitor 15a is added in the output voltage of the converter, and the single-phase two-level converter 40 therefore outputs a difference voltage through the pulse-width modulation control performed by the control unit 150, the difference voltage having been obtained by subtracting the voltage across the capacitor 15a from the output voltage command value Vref for the entire converter.

While a condition "Vref>Vthr2" is satisfied (between the times t2 and t3), the control unit 150 puts the switching devices 5a and 5d included in the single-phase three-level converter 50 in the ON state.

Consequently, voltages across the capacitors 15a and 15b are added to the output voltage of the converter, and the single-phase two-level converter 40 therefore outputs a difference voltage through the pulse-width modulation control performed by the control unit 150, the difference voltage having been obtained by subtracting the voltages across the capacitors 15a and 15b from the output voltage command value Vref for the entire converter.

While a condition "−Vthr1>Vref≥−Vthr2" is satisfied (between the times t5 and t6 and between the times t7 and t8), the control unit 150 puts the switching devices 5b, 5e, and 5f included in the single-phase three-level converter 50 in the ON state. Consequently, the voltage across the capacitor 15b is subtracted from the output voltage of the converter, and the single-phase two-level converter 40 therefore outputs a difference voltage through the pulse-width modulation control performed by the control unit 150, the difference voltage having been obtained by adding the voltage across the capacitor 15b to the output voltage command value Vref for the entire converter.

While a condition "−Vthr2>Vref" is satisfied (between the times t6 and t7), the control unit 150 puts the switching devices 5b and 5c included in the single-phase three-level converter 50 in the ON state. Consequently, the voltages across the capacitors 15a and 15b are subtracted from the output voltage of the converter, and the single-phase two-level converter 40 therefore outputs a difference voltage through the pulse-width modulation control performed by the control unit 150, the difference voltage having been obtained by adding the voltage across the capacitors 15a and 15b to the output voltage command value Vref for the entire converter.

The control unit 150 according to the present embodiment thus controls the switching devices 5a to 5f included in the single-phase three-level converter 50 in multiples of a certain voltage (the threshold values of ±Vthr2 and the threshold values of ±Vthr1). The control unit 150 additionally controls the switching devices 4a to 4d included in the single-phase two-level converter 40 in response to changes in output voltage that are smaller than the certain voltage.

Figure 4:
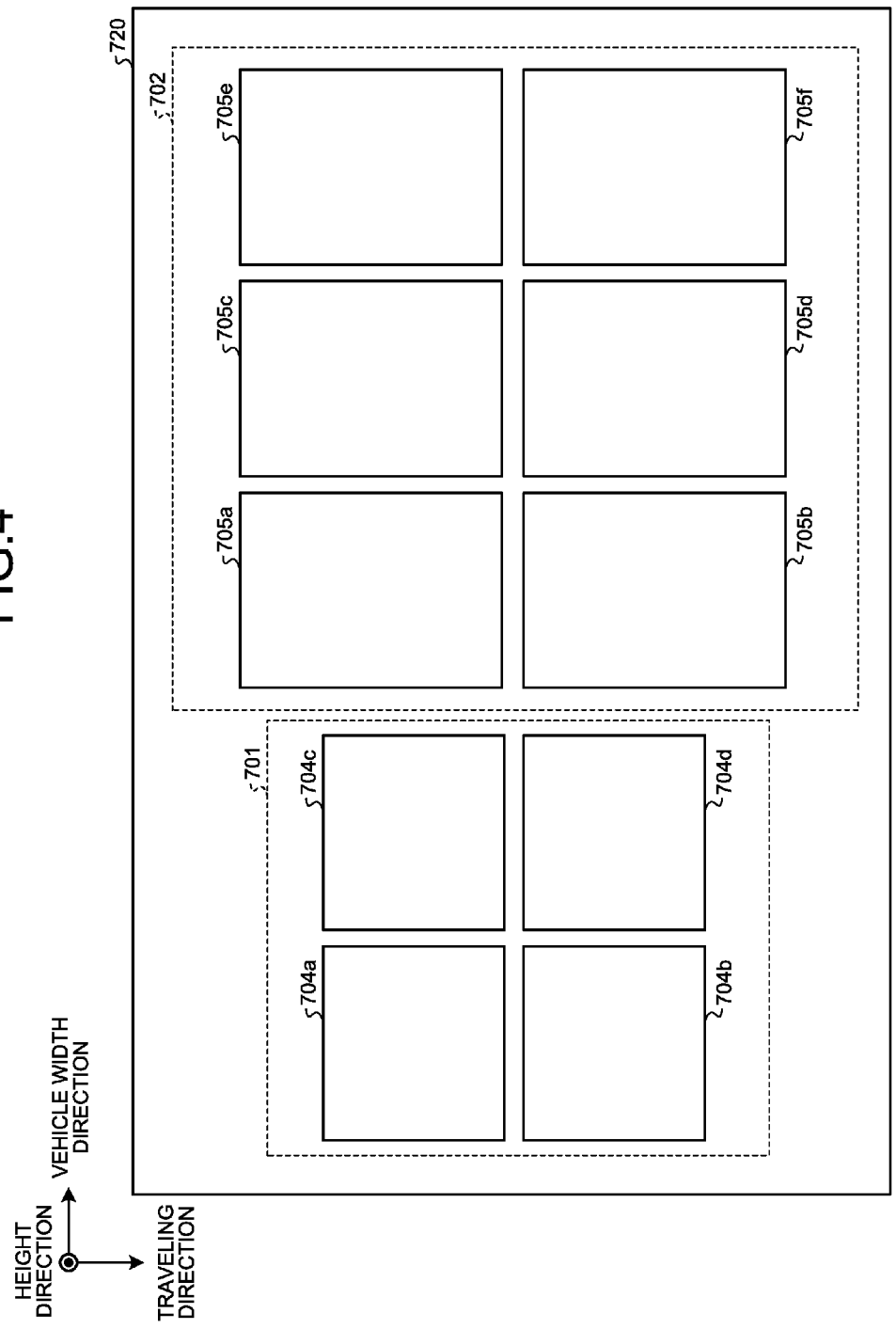
FIG. 4 is a diagram illustrating an example of the arrangement of power modules included in the vehicle power conversion device.

FIG. 4 is a diagram illustrating an example of the arrangement of power modules included in the vehicle power conversion device 11. As illustrated in FIG. 4, a cooling device 720 is provided in the vehicle power conversion device 11. On the cooling device 720, there are a two-level use region 701 provided for the single-phase two-level converter 40 and a three-level use region 702 provided for the single-phase three-level converter 50. In addition, one switching device (for example, a corresponding one among the switching devices 4a to 4d and 5a to 5f) is embedded in each power module (for example, each one among power modules 704a to 704d and 705a to 705f) illustrated in FIG. 4. Although FIG. 4 illustrates a case in which one switching device is embedded in one power module, two or more switching devices may be embedded in one power module.

On the two-level use region 701 provided for the single-phase two-level converter 40, a switching circuit for the single-phase two-level converter 40 is formed, and the power modules 704a to 704d are arranged. In these power modules 704a to 704d, the switching devices 4a to 4d are embedded. The arrangement of the capacitor 14 for the single-phase two-level converter 40 is described later.

On the three-level use region 702 provided for the single-phase three-level converter 50, a switching circuit for the single-phase three-level converter 50 is formed, and the power modules 705a to 705f are arranged. In these power modules 705a to 705f, the switching devices 5a to 5f are embedded. The arrangement of the capacitors 15a and 15b for the single-phase three-level converter 50 is described later.

As illustrated in FIG. 4, the power modules 704a to 704d for the single-phase two-level converter 40 and the power modules 705a to 705f for the single-phase three-level converter 50 are provided on the same cooling device 720.

The cooling device 720 is constructed as a cooling fin, and cools the power modules 704a to 704d and the power modules 705a to 705f by use of, for example, traveling wind of a vehicle. The thus structured cooling device 720 is often installed in a place that makes it possible to make contact therewith from the outside in order that the cooling efficiency thereof may be increased. When the cooling device 720 is installed in a place that makes it possible to make contact therewith, the cooling device 720 needs to be grounded so that the safety can be secured.

As described above, the potential of the power modules 704a to 704d having the switching devices 4a to 4d embedded therein is different from the potential of the power modules 705a to 705f having the switching devices 5a to 5f embedded therein. In consideration of these points, it is necessary that insulation media be provided between the cooling device 720 and the power modules 704a to 704d and between the cooling device 720 and the power modules 705a to 705f. However, this may possibly result in a more complicated structure and lower cooling performance.

For this reason, the present embodiment is provided with no insulation media between the cooling device 720 and the power modules 704a to 704d and between the cooling device 720 and the power modules 705a to 705f. In addition, the present embodiment employs the power modules 705a to 705f that have dielectric strength voltages equal to or higher than a potential applicable to the capacitor 15a or 15b, and employs the power modules 704a to 704d that have dielectric strength voltages equal to or higher than a potential derived by adding a potential applicable to the capacitor 14 to a potential applicable to the capacitor 15a or 15b.

The power modules 704a to 704d are thus provided with higher dielectric strength voltages than the power modules 705a to 705f. That is, while the power modules 705a to 705f for the single-phase three-level converter 50 have higher voltage resistance than the power modules 704a to 704d for the single-phase two-level converter 40, the power modules 704a to 704d for the single-phase two-level converter 40 have higher dielectric strength voltages than the power modules 705a to 705f for the single-phase three-level converter 50.

Figure 5:
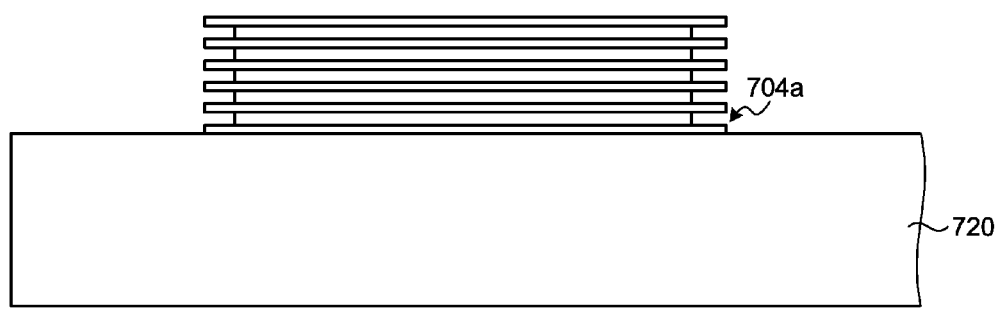
FIG. 5 is a diagram illustrating an example of a side face of a power module in the vehicle power conversion device according to the first embodiment.

Lengthening the creepage distance of a power module is considered as one approach to improve the dielectric strength voltage thereof. FIG. 5 is a diagram illustrating a side face of the power module 704a. As illustrated in FIG. 5, the dielectric strength voltage can be improved with the creepage distance lengthened as a result of forming a side-face part of the power module 704a in a concavo-convex shape. Although FIG. 5 illustrates the case of the power module 704a, it is assumed that the other power modules 704b to 704d also (and the power modules 705a to 705f also) have the similar shape. The example illustrated in FIG. 5 is an example of the shape of a power module for lengthening the creepage distance thereof, and a power module may have another shape that can lengthen the creepage distance. Furthermore, an approach other than lengthening the creepage distance may be taken to improve the dielectric strength voltage.

Next, the arrangement of the capacitors is described. FIG. 6 is a diagram illustrating an example of the arrangement of the capacitors according to the present embodiment as viewed from above. In the example illustrated in FIG. 6, the capacitor 14 is arranged above the power modules 704a to 704d in the two-level use region 701. Furthermore, the capacitor 15a is arranged above the power modules 705a, 705c, and 705e in the three-level use region 702, and the capacitor 15b is arranged above the power modules 705b, 705d, and 705f in the three-level use region 702.

FIG. 7 is a diagram illustrating an example of an arrangement when the vehicle power conversion device 11 according to the present embodiment is viewed from one side. As illustrated in FIG. 10, a heat dissipating part 1001 of the cooling device 720 is exposed to the outside of the vehicle power conversion device 11, and a fin (heat sink) included in the heat dissipating part 1001 is arranged along the traveling direction of a vehicle so as to be cooled by traveling wind while the vehicle is traveling.

The power modules 704b, 704d, 705b, 705d, and 705f are arranged on the cooling device 720. The power modules 704a, 704c, 705a, 705c, and 705e that cannot be viewed in FIG. 7 are also arranged on the cooling device 720.

In addition, as illustrated in FIG. 7, the capacitor 14 provided in the single-phase two-level converter 40 is provided above and near the power modules (704a to 704d). Similarly, the capacitors 15a and 15b provided in the single-phase three-level converter 50 is provided above and near the power modules (705a to 705f).

The circuit of the single-phase two-level converter 40 is provided in a space 1002 between the capacitor 14 and the power modules 704a to 704d. The capacitor 14 is thus located near to the power modules 704a to 704d, so that a current path within the circuit of the single-phase two-level converter 40 is shorter than otherwise.

Similarly, the circuit of the single-phase three-level converter 50 is provided in a space 1003 between the capacitors 15a and 15b and the power modules 705a to 705f. The capacitors 15a and 15b are thus located near to the power modules 705a to 705f, so that a current path within the circuit of the single-phase three-level converter 50 is shorter than otherwise.

That is, while a circuit inductance increases as a current path within a converter circuit is longer, the present embodiment enables reduction of a circuit inductance in such a manner that capacitors (the capacitor 14 and the capacitors 15a and 15b) are arranged above and near power modules (the power modules 704a to 704d and the power modules 705a to 705f) included in converters (the single-phase two-level converter 40 and the single-phase three-level converter 50).

Here, the power modules 704a to 704d (with low breakdown voltages) that include the respective switching devices 4a to 4d in the single-phase two-level converter 40 can reduce switching losses as compared to the power modules 705a to 705f (with high breakdown voltages) that include the switching devices 5a to 5f. In the single-phase two-level converter 40, however, high-speed switching operation is performed, and switching is performed a larger number of times than in the single-phase three-level converter 50. Furthermore, the power modules 704a to 704d have a smaller heat dissipating area than the power modules 705a to 705f. For this reason, the power modules 704a to 704d for the single-phase two-level converter 40 are likely to increase in temperature more than the power modules 705a to 705f for the single-phase three-level converter 50.

For this reason, the present embodiment employs, as the power modules 704a to 704d in which the switching devices 4a to 4d included in the single-phase two-level converter 40 are embedded, power modules that have a higher operating temperature limit than the power modules 705a to 705f in which the switching devices 5a to 5f included in the single-phase three-level converter 50 are embedded. Consequently, higher stability can be achieved even when high-speed switching operation is performed.

In the present embodiment, inclusion of the above described structures makes it possible to arrange the power modules 704a to 704d and the power modules 705a to 705f directly on the same cooling device 720 that has been grounded. The need to provide insulation media is thus eliminated, so that cooling performance improvement can be achieved with structural simplification.

Second Embodiment

The first embodiment is described above using an example in which the power modules 704a to 704d in which the switching devices 4a to 4d included in the single-phase two-level converter 40 are embedded and the power modules 705a to 705f in which the switching devices 5a and 5f included in the single-phase three-level converter 50 are embedded are arranged on the same cooling device 720. However, the above-described embodiment is not intended to limit the power modules 704a to 704d and the power modules 705a to 705f to being arranged on the same cooling device 720. For this reason, described in the second embodiment is an example in which the power modules 704a to 704d and the power modules 705a to 705f are arranged on different cooling devices.

A vehicle power conversion device 11 according to the second embodiment is assumed to include the same circuit configuration as (the configuration illustrated in FIG. 1 of) the vehicle power conversion device 11 according to the first embodiment, and description thereof is omitted here.

FIG. 8 is a diagram illustrating an example of the arrangement of power modules included in the vehicle power conversion device 11 according to the second embodiment. As illustrated in FIG. 8, there are a two-level use cooling device 1120 provided for the single-phase two-level converter 40 and a three-level use cooling device 1121 provided for the single-phase three-level converter 50.

A two-level use region 1130 provided for the single-phase two-level converter 40 is provided on the two-level use cooling device 1120. A three-level use region 1131 provided for the single-phase three-level converter 50 is provided on the three-level use cooling device 1121. In addition, one switching device (for example, a corresponding one among the switching devices 4a to 4d and 5a to 5f) is embedded in each power module (for example, each one among power modules 704a to 704d and 705a to 705f) illustrated in FIG. 8. Although FIG. 8 illustrates a case in which one switching device is embedded in one power module, two or more switching devices may be embedded in one power module.

In the two-level use region 1130 provided on the two-level use cooling device 1120 for the single-phase two-level converter 40, a switching circuit for the single-phase two-level converter 40 is formed, and the power modules 704a to 704d are arranged. In these power modules 704a to 704d, the switching devices 4a to 4d are embedded. The arrangement of the capacitor 14 for the single-phase two-level converter 40 is described later.

In the three-level use region 1131 provided on the three-level use cooling device 1121 for the single-phase three-level converter 50, a switching circuit for the single-phase three-level converter 50 is formed, and the power modules 705a to 705f are arranged. In these power modules 705a to 705f, the switching devices 5a to 5f are embedded. The arrangement of the capacitors 15a and 15b for the single-phase three-level converter 50 is described later.

Next, the arrangement of the capacitors is described. FIG. 9 is a diagram illustrating an example of the arrangement of the capacitors according to the present embodiment as viewed from above. In the example illustrated in FIG. 9, the capacitor 14 is arranged above the power modules 704a to 704d in the two-level use region 1130. Furthermore, the capacitor 15b is arranged above the power modules 705b, 705d, and 705f in the three-level use region 1131, and the capacitor 15a is arranged above the power modules 705a, 705c, and 705e in the three-level use region 1131.

Here, no harm is caused even if the inductance between the single-phase two-level converter 40 and the single-phase three-level converter 50 is high. Therefore, when the two-level use cooling device 1120 is installed in a place that makes it impossible to make contact therewith and is thereby freed of the need to be grounded, there is no need to take the dielectric strength voltages of the power modules 704a to 704d into consideration as in the case of the first embodiment.

FIG. 10 is a diagram illustrating an example of an arrangement when the vehicle power conversion device 11 according to the present embodiment is viewed from one side. In FIG. 10, while the two-level use cooling device 1120 on which the single-phase two-level converter 40 is arranged is installed inside the device, the three-level use cooling device 1121 on which the single-phase three-level converter 50 is arranged is arranged so as to have a part thereof exposed to the outside of the device. The single-phase two-level converter 40 and the single-phase three-level converter 50 are connected to each other by a connection conductor 1301.

As illustrated in FIG. 10, a heat dissipating part 1302 of the three-level use cooling device 1121 is exposed to the outside environment of the vehicle power conversion device 11, and a fin (heat sink) included in the heat dissipating part 1302 is arranged along the traveling direction of a vehicle so as to be cooled by traveling wind (air) while the vehicle is traveling. For this reason, it is necessary that the three-level use cooling device 1121 be grounded and that the power modules 705a to 705f have the same dielectric strength voltages as in the first embodiment.

In contrast, the two-level use cooling device 1120 is contained inside the vehicle power conversion device 11 (in other words, is configured so as not to be exposed to the outside environment), and the two-level use cooling device 1120 is forcibly cooled by use of a fan (a cooling unit) (not illustrated) or the like. That is, a fan or the like is employed here for the forcible cooling because the cooling effect caused by traveling wind is weakened with the two-level use cooling device 1120 arranged in a place that makes it impossible to make contact therewith. Furthermore, the power modules 704a to 704d do not need to have structures having dielectric strength voltages as in the first embodiment because the potential difference between the power modules 704a to 704d and the two-level use cooling device 1120, such as the potential difference that occurs in the first embodiment, do not occur as a result of configuring the two-level use cooling device 1120 so as not to be grounded.

In addition, the capacitor 14 provided in the single-phase two-level converter 40 is provided above and near the power modules (704a to 704d). Similarly, the capacitors 15a and 15b provided in the single-phase three-level converter 50 is provided above and near the power modules (705a to 705f).

Consequently, as in the case of the first embodiment, current paths in the circuits of the single-phase two-level converter 40 and the single-phase three-level converter 50 can be short. That is, in the single-phase two-level converter 40 and the single-phase three-level converter 50 according to the present embodiment, circuit inductances can be reduced as in the case of the first embodiment.

Furthermore, the switching losses of the power modules 704a to 704d for the single-phase two-level converter 40 can be reduced as compared with the (high-voltage) power modules 705a to 705f for the single-phase three-level converter 50. In the single-phase two-level converter 40, however, switching is performed a larger number of times and a heat dissipating area is smaller than in the single-phase three-level converter 50, and these factors likely to cause a larger temperature increase.

For this reason, the present embodiment employs, as each of the power modules 704a to 704d for the single-phase two-level converter 40, a power module that has a higher operating temperature limit than the power modules 705a to 705f for the single-phase three-level converter 50. Consequently, higher stability can be achieved even when high-speed switching operation is performed.

In the present embodiment, inclusion of the above-described structures eliminates the need to provide insulation media between the power modules 704a to 704d and the two-level use cooling device 1120 and between the power module 705a to 705f and the power modules 705a to 705f, so that structural simplification and cooling performance improvement can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A vehicle power conversion device that is a power conversion device that converts single-phase alternating-current power into direct-current power, the vehicle power conversion device comprising:
   a two-level converter, the two-level converter comprising:
      a capacitor;
      first switching devices connected in series to each other via a first connection point and connected in parallel to the capacitor, the first switching devices each including a switching element having self arc-extinguishing capability and a diode connected in an anti-parallel manner to the switching element, the first connection point being connected to a power supply that supplies the single-phase alternating-current power; and
      second switching devices connected in series to each other via a second connection point and connected in parallel to the capacitor, the second switching devices each having the same configuration as each of the first switching devices;
   a three-level converter, the three-level converter comprising:
      two capacitors connected in series to each other;
      third switching devices connected in series to each other via a third connection point and connected in parallel to the two capacitors connected in series to each other, the third connection point being connected to the second connection point, the third switching devices each having the same configuration as each of the first switching devices; and
      fourth switching devices connected in series to each other via a fourth connection point and connected in parallel to the two capacitors connected in series to each other, the fourth switching devices each having the same configuration as each of the first switching devices, wherein
      a bidirectional switch provided on a path from the fourth connection point to a neutral point, the bidirectional switch including a plurality of switching devices connected in series to one another with the polarities thereof reversed to one another; and
   one cooling device;
   first power modules in which the respective first and second switching devices are embedded; and
   second power modules in which the respective third and fourth switching devices are embedded, wherein
   the first power module and the second power module are installed on the one cooling device,
   the second power modules have dielectric strength voltages equal to or higher than a voltage applicable to any one of the two capacitors connected in series to each other included in the three-level converter, and
   the first power modules have dielectric strength voltages equal to or higher than a sum of a voltage applicable to any one of the two capacitors connected in series to each other included in the three-level converter and a voltage applicable to the capacitor included in the two-level converter.

2. The vehicle power conversion device according to claim 1, wherein:
   the capacitor included in the two-level converter is installed above and near the first power modules, and
   the capacitors included in the three-level converter are installed above and near the second power modules.

3. The vehicle power conversion device according to claim 1, wherein the first power modules have higher operating temperature limits than the second power modules.

4. A vehicle power conversion device that is a power conversion device that converts single-phase alternating-current power into direct-current power, the vehicle power conversion device comprising:
   a capacitor;
   first switching devices connected in series to each other via a first connection point and connected in parallel to the capacitor, the first switching devices each including a switching element having self arc-extinguishing capability and a diode connected in an anti-parallel manner to the switching element, the first connection point being connected to a power supply that supplies the single-phase alternating-current power; and
   second switching devices connected in series to each other via a second connection point and connected in parallel to the capacitor, the second switching devices each having the same configuration as each of the first switching devices;
   a three-level converter, the three-level converter comprising:
      two capacitors connected in series to each other;
      third switching devices connected in series to each other via a third connection point and connected in parallel to the two capacitors connected in series to each other, the third connection point being connected to the second connection point, the third switching devices each having the same configuration as each of the first switching devices; and
      fourth switching devices connected in series to each other via a fourth connection point and connected in parallel to the two capacitors connected in series to each other, the fourth switching devices each having the same configuration as each of the first switching devices, wherein
      a bidirectional switch provided on a path from the fourth connection point to a neutral point, the bidirectional switch including a plurality of switching devices connected in series to one another with the polarities thereof reversed to one another;
   a first cooling device;
   a second cooling device;
   first power modules in which the respective first and second switching devices, the first power modules being installed on the first cooling device,
   second power modules in which the respective third and fourth switching devices, the second power modules being installed on the second cooling device.

5. The vehicle power conversion device according to claim 4, wherein:
   the first cooling device is provided without being grounded and so as not to be exposed to an outside environment, and performs forcible cooling by use of a cooling unit, and
   the second cooling device is grounded and is exposed to the outside environment.

6. The vehicle power conversion device according to claim 4, wherein:
   the capacitor included in the two-level converter is installed above and near the first power modules, and
   the capacitors included in the three-level converter are installed above and near the second power modules.

7. The vehicle power conversion device according to claim 4, wherein the first power modules have higher operating temperature limits than the second power modules.

* * * * *